United States Patent
Ryu et al.

(10) Patent No.: US 10,964,565 B2
(45) Date of Patent: Mar. 30, 2021

(54) SUBSTRATE PROCESSING APPARATUS AND METHOD

(71) Applicants: PSK INC., Gyeonggi-do (KR); PSK Holdings Inc., Gyeonggi-do (KR)

(72) Inventors: Je Hyeok Ryu, Gyeonggi-do (KR); Jae Kyeong Yoo, Gyeonggi-do (KR); Jung-Hyun Kang, Gyeonggi-do (KR)

(73) Assignees: PSK INC., Hwaseong-si (KR); PSK HOLDINGS INC., Hwaseong-si (KR)

( * ) Notice: Subject to any disclaimer, the term of this patent is extended or adjusted under 35 U.S.C. 154(b) by 0 days.

(21) Appl. No.: 16/557,707

(22) Filed: Aug. 30, 2019

(65) Prior Publication Data
US 2020/0211871 A1    Jul. 2, 2020

(30) Foreign Application Priority Data
Jan. 2, 2019    (KR) .................. 10-2019-0000254

(51) Int. Cl.
*H01L 21/67*    (2006.01)
*H01L 21/687*    (2006.01)

(52) U.S. Cl.
CPC .. *H01L 21/67196* (2013.01); *H01L 21/67017* (2013.01); *H01L 21/68707* (2013.01)

(58) Field of Classification Search
CPC ......... H01L 21/67196; H01L 21/67017; H01L 21/68707
USPC ....................................................... 438/800
See application file for complete search history.

(56) References Cited

U.S. PATENT DOCUMENTS

| | | | | |
|---|---|---|---|---|
| 6,817,822 B2* | 11/2004 | Tokunaga | ......... | H01L 21/67772 414/217 |
| 7,789,609 B2* | 9/2010 | Okabe | ............... | H01L 21/67772 414/217 |
| 2004/0105738 A1* | 6/2004 | Ahn | ........................ | H01L 21/00 414/222.01 |
| 2013/0209200 A1* | 8/2013 | Furuichi | ........... | H01L 21/67739 414/222.07 |
| 2014/0176701 A1* | 6/2014 | Okuno | .............. | H01L 21/67742 348/125 |
| 2016/0160168 A1* | 6/2016 | Tokumaru | ............... | C12M 29/20 435/303.1 |
| 2018/0174875 A1* | 6/2018 | Kim | .................. | H01L 21/67393 |

FOREIGN PATENT DOCUMENTS

| | | |
|---|---|---|
| JP | 2004-200669 A | 7/2004 |
| JP | 2015-204344 A | 11/2015 |
| KR | 10-0486690 B1 | 5/2005 |
| KR | 10-2008-0075202 A | 8/2008 |
| KR | 10-2018-0016594 A | 3/2020 |

OTHER PUBLICATIONS

Office Action in related Korean Patent Application No. 10-2019-0000254 dated May 8, 2020; 8 pages.

* cited by examiner

*Primary Examiner* — Vu A Vu
(74) *Attorney, Agent, or Firm* — Procopio, Cory, Hargreaves & Savitch LLP

(57) ABSTRACT

Disclosed is a substrate processing apparatus that includes an interference member for minimizing a collision between a descending flow of gas supplied by a fan unit and a gas flow directed toward a transfer space from the inside of a container.

17 Claims, 15 Drawing Sheets

SUBSTRATE PROCESSING APPARATUS AND METHOD

CROSS-REFERENCE TO RELATED APPLICATIONS

A claim for priority under 35 U.S.C. § 119 is made to Korean Patent Application No. 10-2019-0000254 filed on Jan. 2, 2019, in the Korean Intellectual Property Office, the entire contents of which are hereby incorporated by reference.

BACKGROUND

Embodiments of the inventive concept described herein relate to a substrate processing apparatus and a substrate processing method.

In general, semiconductor manufacturing processes include various processes such as deposition, photolithography, etching, ashing, cleaning, and the like. Semiconductor manufacturing facilities for the semiconductor manufacturing processes include a wafer transfer module, also referred to as an equipment front end module (EFEM).

Recently, with the high integration of a semiconductor device or the scaling-down of the critical dimension (CD) of a pattern formed on a substrate, it is required to maintain surroundings of the substrate at a high-cleanliness level to prevent particles or water marks on the substrate. Furthermore, a method of supplying an inert gas around the substrate or creating a vacuum in a space in which the substrate is processed is widely used to prevent a change in the property and state of the substrate surface, such as oxidation of the substrate surface. To appropriately maintain the atmosphere around the substrate, the substrate is managed in a hermetic storage pod called a front-opening unified pod (FOUP). The FOUP is filled with an inert gas. A transfer robot in the aforementioned equipment front end module transfers the substrate between the FOUP and a process module.

FIG. 1 is a view illustrating an equipment front end module 1 in the related art. Referring to FIG. 1, the equipment front end module 1 in the related art includes a fan 2, a FOUP 4, a transfer robot 6, and an exhaust line 9. The fan 2 supplies an inert gas into a transfer space 3 to which a substrate is transferred. The inert gas supplied into the transfer space 3 is discharged through the exhaust line 9.

When the substrate is transferred in the equipment front end module 1, a door 8 is opened, and an inert gas is continually supplied into the FOUP 4 to prevent the gas flow in the transfer space 3 from being introduced into the FOUP 4. However, this method uses a vast amount of inert gas, increasing substrate processing cost.

Maintaining the transfer space 3 in an inert gas atmosphere may be considered as another way of transferring the substrate in the equipment front end module 1. For example, as illustrated in FIG. 1, the fan 2 supplies the inert gas into the transfer space 3 to maintain the transfer space 3 in the inert gas atmosphere. However, the inert gas is required to be consistently supplied to maintain the transfer space 3 in the inert gas atmosphere. Even in this case, a vast amount of inert gas is used. Therefore, this method is not appropriate as a solution to the increase in the processing cost.

Furthermore, when the fan 2 supplies the inert gas, the inert gas supplied by the fan 2 and the inert gas released from the FOUP 4 collide with each other to cause a vortex in the transfer space 3. The vortex collides with components in the transfer space 3 to cause particles.

SUMMARY

Embodiments of the inventive concept provide a substrate processing apparatus and method for efficiently processing substrates.

Embodiments of the inventive concept provide a substrate processing apparatus and method for minimizing the generation of particles in an index module.

Embodiments of the inventive concept provide a substrate processing apparatus and method for minimizing attachment of particles to a substrate.

Embodiments of the inventive concept provide a substrate processing apparatus and method for minimizing the amount of inert gas supplied into the index module when a substrate is transferred.

Aspects of the inventive concept are not limited thereto, and any other aspects not mentioned herein will be clearly understood from the following description by those skilled in the art to which the inventive concept pertains.

According to an aspect of an embodiment, an apparatus for processing a substrate includes an index module and a process module that processes the substrate. The index module includes a load port on which a container having the substrate received therein is placed and a transfer frame that is disposed between the load port and the process module and that has a transfer space therein. The transfer frame includes a fan unit provided above the transfer space to supply a descending flow of gas into the transfer space, a transfer robot disposed in the transfer space to transfer the substrate between the container placed on the load port and the process module, and an interference member that minimizes a collision between the descending gas flow and a gas flow directed toward the transfer space from the inside of the container. The transfer frame has an opening formed therein, through which the substrate is transferred between the container and the transfer frame. The interference member includes an upper interference member installed at an upper end of the opening so as to be adjacent to the opening.

According to an embodiment, the upper interference member may be provided in a mesh form.

According to an embodiment, the upper interference member may be upwardly inclined in a direction away from the opening.

According to an embodiment, the interference member may further include a lower interference member installed at a lower end of the opening so as to be adjacent to the opening.

According to an embodiment, the lower interference member may be provided in a mesh form.

According to an embodiment, the lower interference member may be downwardly inclined in a direction away from the opening.

According to an embodiment, the fan unit may include a housing having an inner space and a fan disposed in the inner space to cause the gas to flow into or out of the inner space. The transfer frame may further include a circulation duct that circulates the gas in the transfer space into the inner space.

According to an embodiment, the transfer frame may have a rectangular parallelepiped shape, and a plurality of circulation ducts may be installed in corners of the transfer frame when viewed from above.

According to an embodiment, the transfer frame may further include a plurality of panels, a coupling frame that combines the plurality of panels, and gaskets provided between the panels and the coupling frame. The transfer frame may have the transfer space formed by combining the plurality of panels together.

According to an embodiment, the gaskets may be rubber gaskets or liquid gaskets.

According to an embodiment, a circulation fan may be installed in the circulation duct to cause the gas to flow into or out of the circulation duct.

According to an embodiment, the apparatus may further include an actuator that drives the transfer robot. The transfer frame may further include a base that isolates a space in which the actuator is provided from the transfer space.

According to an embodiment, the index module may further include a gas supply member that supplies the gas into the transfer space, and the gas supply member may include a first gas supply line that supplies the gas into an inner space of a housing that the fan unit includes and a second gas supply line that directly supplies the gas into the transfer space.

According to an embodiment, the apparatus may further include a controller that controls the gas supply member. The controller may control the gas supply member to supply the gas from the first gas supply line to the fan unit for a period of transfer during which the substrate is transferred and to supply the gas through the second gas supply line or through the first gas supply line and the second gas supply line for a period of charging prior to the period of transfer.

According to an embodiment, the index module may further include a load lock chamber disposed between the transfer frame and the process module, and the gas supply member may further include a third gas supply line connected to the load lock chamber to supply gas into the load lock chamber. The controller may additionally control the load lock chamber and, for the period of charging, may control the load lock chamber and the third gas supply line to open a door for opening or closing an entrance through which the substrate is transferred between the load lock chamber and the transfer frame and to cause the gas supplied into the load lock chamber from the third gas supply line to flow into the transfer space.

According to an embodiment, the index module may further include an exhaust unit that discharges the gas in the transfer space to the outside and a controller that controls the fan unit and the exhaust unit. The controller may control the fan unit and the exhaust unit to maintain a pressure difference of 50 Pa to 1000 Pa between the transfer space and the outside of the index module.

According to another aspect of an embodiment, a method for processing a substrate includes supplying the gas from the first gas supply line to the fan unit for a period of transfer during which the substrate is transferred and supplying the gas through the second gas supply line or through the first gas supply line and the second gas supply line for a period of charging prior to the period of transfer.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
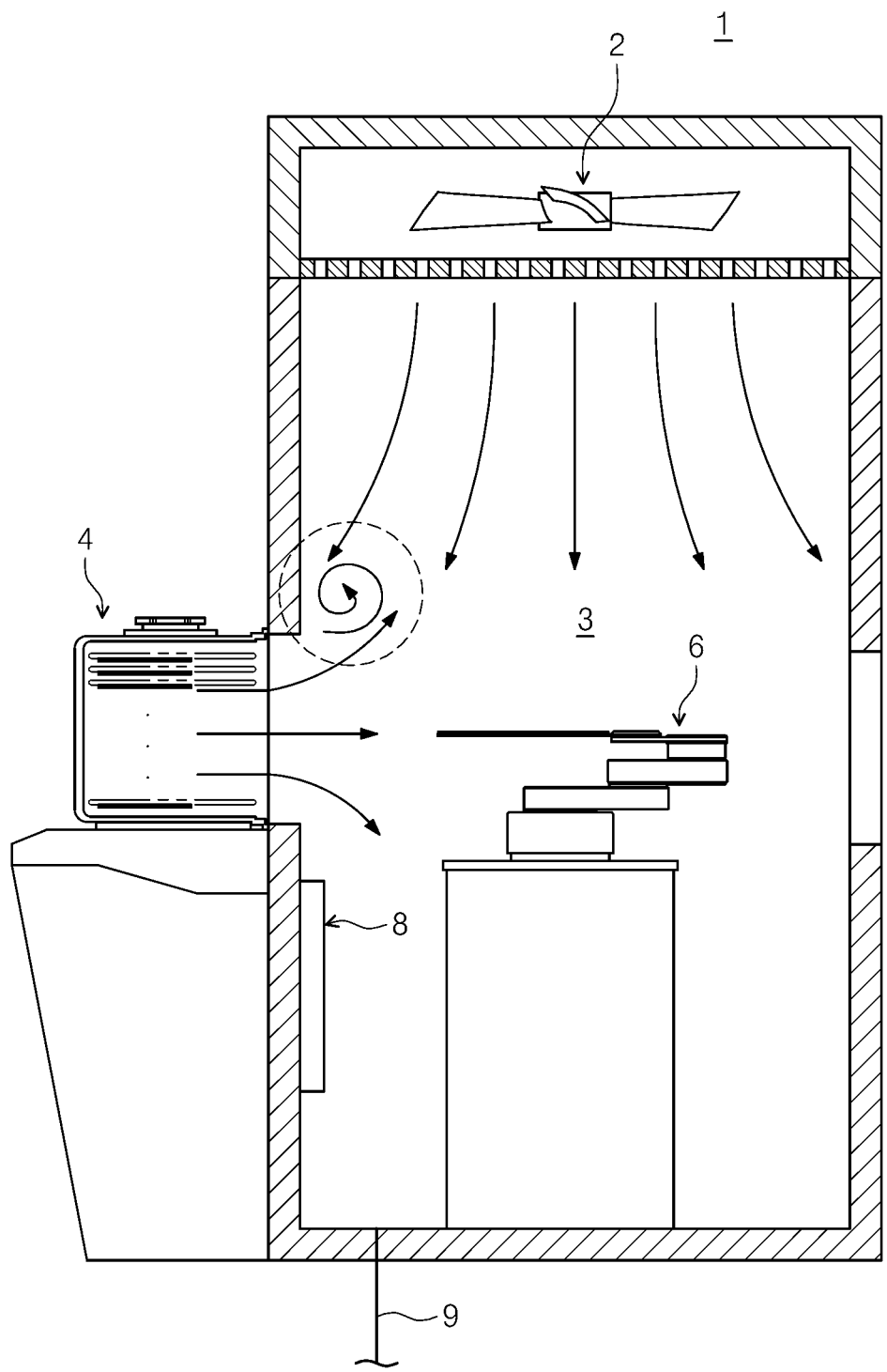
FIG. 1 is a view illustrating an equipment front end module in the related art.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise" and "have" when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

Hereinafter, embodiments of the inventive concept will be described in detail with reference to FIGS. 2 to 15.

Figure 2:
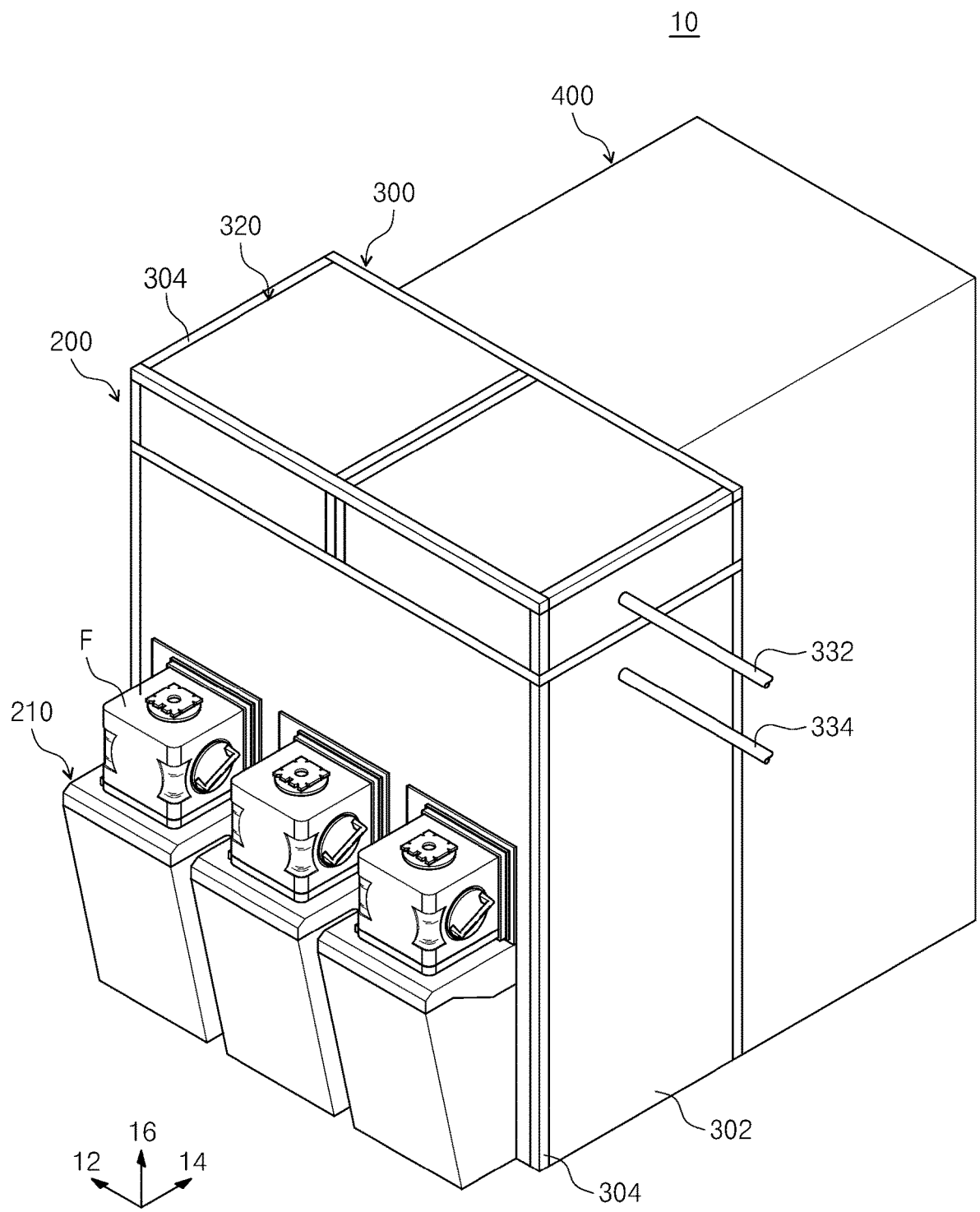
FIG. 2 is a perspective view illustrating a substrate processing apparatus according to an embodiment of the inventive concept.
Figure 3:
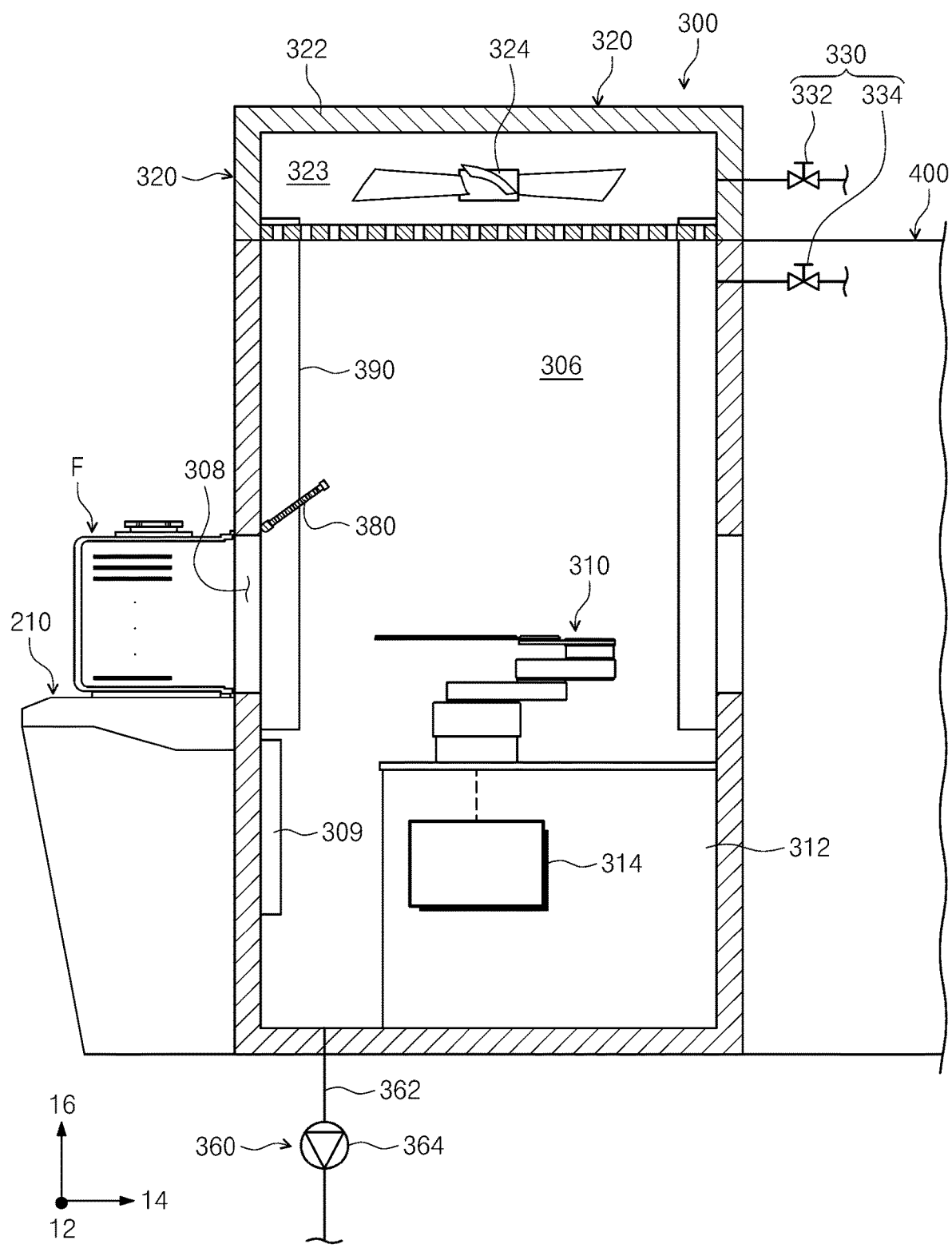
FIG. 3 is a sectional view illustrating a transfer frame of FIG. 2.

FIG. 2 is a perspective view illustrating a substrate processing apparatus 10 according to an embodiment of the inventive concept, and FIG. 3 is a sectional view illustrating a transfer frame 300 of FIG. 2. Referring to FIGS. 2 and 3, the substrate processing apparatus 10 includes an index module 200 and a process module 400.

The index module 200 includes a load port 210 and the transfer frame 300. The load port 210 is an apparatus for loading or unloading substrates into or from the transfer frame 300. The load port 210 is disposed on a front surface of the transfer frame 300. A container (FOUP) F having the substrates received therein is seated on the load port 210. The load port 210 opens or closes a cover of the container F. The container F is a general lot carrier for production and is seated on the load port 210 by an automated logistics system (e.g., an OHT, an AGV, or an RGV). The load port 210 includes a plate on which the container F is placed. The load port 210 opens the container F and loads the substrates received in the container F into the transfer frame 300. A plurality of load ports 210 may be installed. One or more of the plurality of load ports 210 may supply unprocessed substrates received in containers F to the process module 400. The remaining load ports 210 may place substrates processed by the process module 400 in the containers F. The load ports 210 may supply an inert gas into the containers F seated on the load ports 210. The inert gas may be nitrogen gas. The load ports 210 may supply nitrogen gas into the containers F to maintain the insides of the containers F in a nitrogen atmosphere. The plurality of load ports 210 may be arranged along a first direction 12.

The containers F are apparatuses for preventing contact between the substrates and oxygen and facilitating transfer of the substrates when the substrates are transferred from the outside to the load ports 210 and when processed substrates are transferred for a different process. The containers F may be in the form of a case and may include a door on one side thereof. Each of the containers F may have a plurality of slots formed on inner walls thereof, in which a plurality of substrates are placed so as not to contact each other.

The process module 400 performs substrate processing. The process module 400 may be configured to perform various substrate processing. For example, the process module 400 may include an ashing chamber for removing photoresist. Furthermore, the process module 400 may include a deposition chamber for performing a deposition process. Moreover, the process module 400 may include an etching chamber for etching a thin film on a substrate. The ashing chamber, the deposition chamber, or the etching chamber may process a substrate using plasma. In addition, the process module 400 may include a heating chamber for heating a substrate or a cooling chamber for cooling a substrate.

The transfer frame 300 is disposed between the load ports 210 and the process module 400 and has a transfer space 306 therein. The transfer frame 300 may have a rectangular parallelepiped shape. For example, the transfer frame 300 may include a plurality of panels 302 that are combined together to form a rectangular parallelepiped shape. The plurality of panels 302 are combined together by a coupling frame 304. A gasket (not illustrated) may be provided between the coupling frame 304 and each of the panels 302. The gasket (not illustrated) may be a rubber gasket or a liquid gasket. The gasket (not illustrated), which is provided between the coupling frame 304 and the panel 302, may hermetically seal the transfer space 306 of the transfer frame 300. The panel 302 may have a thickness of 10 mm or more, and the gasket (not illustrated) may have a thickness of 5 mm or more. Accordingly, external particles may be more effectively prevented from being introduced into the transfer space 306. The panel 302 may be formed of a metallic material. The panel 302 may be formed of a material containing aluminum or stainless steel.

The transfer frame 300 includes a transfer robot 310, a fan unit 320, a gas supply member 330, a circulation duct 340, an exhaust unit 360, and an interference member 380.

The transfer robot 310 is disposed in the transfer space 306 of the transfer frame 300. The transfer robot 310 transfers substrates between the containers F placed on the load ports 210 and the process module 400. The transfer robot 310 is driven by an actuator 314. The actuator 314 drives the transfer robot 310 to transfer substrates received in the containers F to the process module 400 or transfer substrates processed by the process module 400 to the containers F.

A base 312 may be provided in the transfer space 306. The base 312 may have a rectangular parallelepiped shape with a space inside. The transfer robot 310 may be installed on an upper surface of the base 312. The actuator 314 may be provided in the base 312. The base 312 isolates the space in which the actuator 314 is provided from the transfer space 306. The base 312 is provided in the transfer space 306 to reduce the volume of the transfer space 306. Accordingly, the amount of inert gas supplied to maintain the transfer space 306 in an inert gas atmosphere may be minimized.

The fan unit 320 may be provided above the transfer space 306 to supply a descending flow of gas into the transfer space 306. The gas supplied by the fan unit 320 may be an inert gas or air, the temperature and humidity of which are controlled. The inert gas may be a gas selected from nitrogen gas, argon gas, and helium gas, or may be a mixture thereof. Furthermore, the gas supplied by the fan unit 320 may be a mixture of an inert gas and air.

The fan unit 320 includes a housing 322 and a fan 324. The housing 322 has an inner space 323. The fan 324 is disposed in the inner space 323 of the housing 322 to cause gas to flow into or out of the inner space 323. Furthermore, The fan unit 320 may be provided in plural. A plurality of fan units 320 may be provided along a second direction 14 perpendicular to the first direction 12 when viewed from above. For example, two fan units 320 may be provided.

The gas supply member 330 may supply gas into the transfer space 306. The gas supply member 330 may include a first gas supply line 332 and a second gas supply line 334. Valves may be installed on the first gas supply line 332 and the second gas supply line 334, respectively. The valves may be on/off valves or flow control valves. The first gas supply line 332 supplies gas into the inner space 323 of the housing 322 that the fan unit 320 includes. The gas supplied into the inner space 323 through the first gas supply line 332 is supplied into the transfer space 306 by driving the fan 324. The second gas supply line 334 directly supplies gas into the transfer space 306. The gas supplied by the first gas supply line 332 and the second gas supply line 334 may be an inert gas or compressed air.

The exhaust unit 360 discharges the gas supplied into the transfer space 306 or impurities such as particles to the outside of the transfer frame 300. The exhaust unit 360 includes an exhaust line 362 and a pump 364. The exhaust line 362 is connected to the transfer space 306 of the transfer frame 300. For example, the exhaust line 362 may be connected to a lower portion of the transfer frame 300. Without being limited thereto, however, the location where the exhaust line 362 is provided may be changed in various ways. The pump 364 provides reduced pressure to the transfer space 306.

The index module 200 may include a controller (not illustrated) that controls the fan unit 320 and the exhaust unit 360. The controller (not illustrated) may control the fan unit 320 and the exhaust unit 360 to adjust the pressure inside the transfer space 306. For example, the controller (not illustrated) may control the fan unit 320 and the exhaust unit 360 to maintain a pressure difference of 50 Pa to 1000 Pa between the transfer space 306 and the outside of the index module 200.

The interference member 380 minimizes a collision between a descending flow of gas supplied into the transfer space 306 by the fan unit 320 and a gas flow directed from the inside of the container F to the transfer space 306. The interference member 380 may be provided in a mesh form. Alternatively, the interference member 380 may be a blocking plate having no through-hole. The interference member 380 may be installed adjacent to an opening 308 through which substrates are transferred between the container F and the transfer frame 300. For example, the interference member 380 may be installed at an upper end of the opening 308. In this case, the interference member 380 may be upwardly inclined in a direction away from the opening 308.

Figure 4:
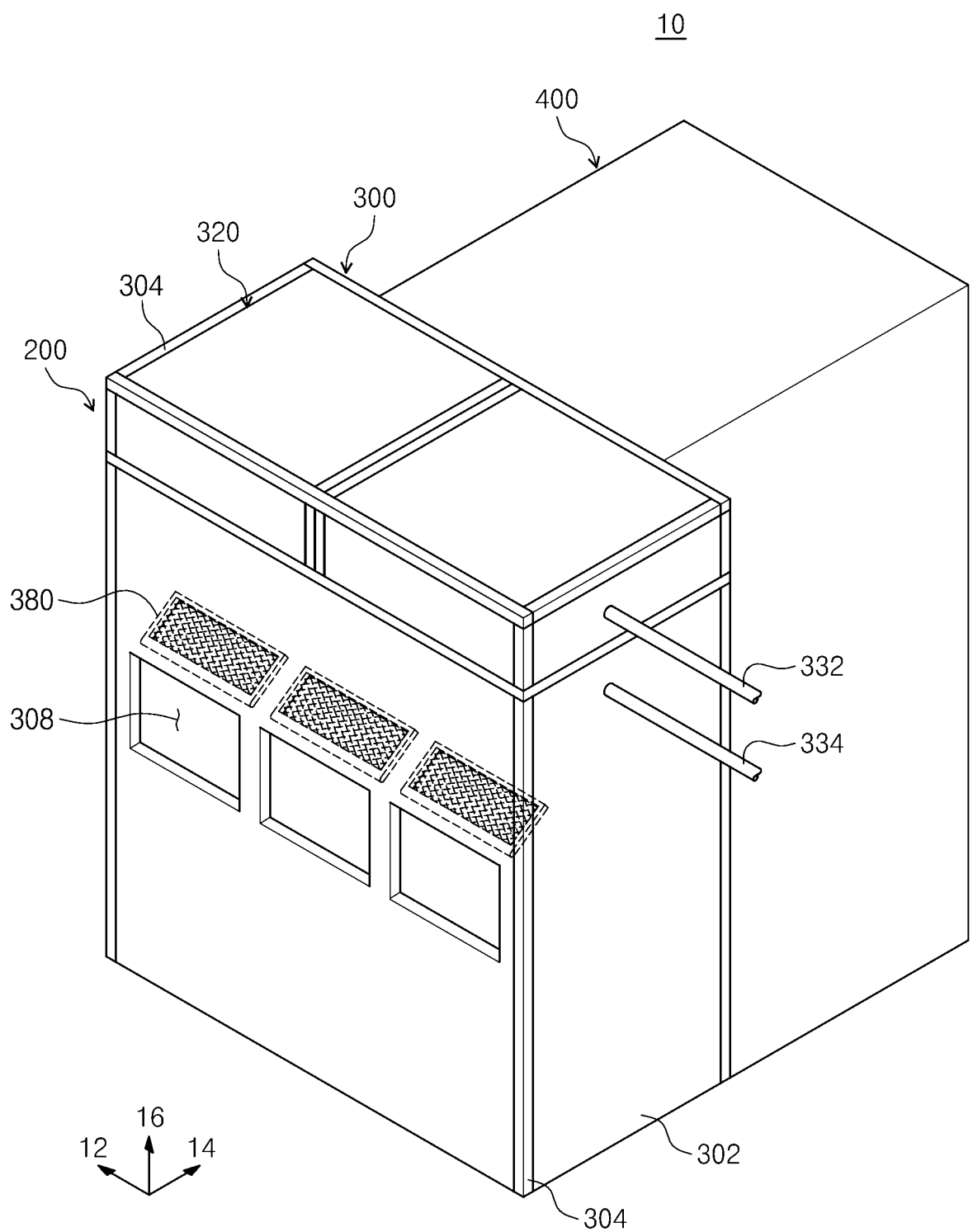
FIG. 4 is a view illustrating a state in which an interference member of FIG. 3 is installed.

Furthermore, a plurality of interference members 380 may be provided as illustrated in FIG. 4. The plurality of interference members 380 may be located to correspond to openings 308, respectively. For example, the plurality of interference members 380 may be installed at upper ends of the openings 308, respectively, and may be upwardly inclined in a direction away from the openings 308.

Figure 5:
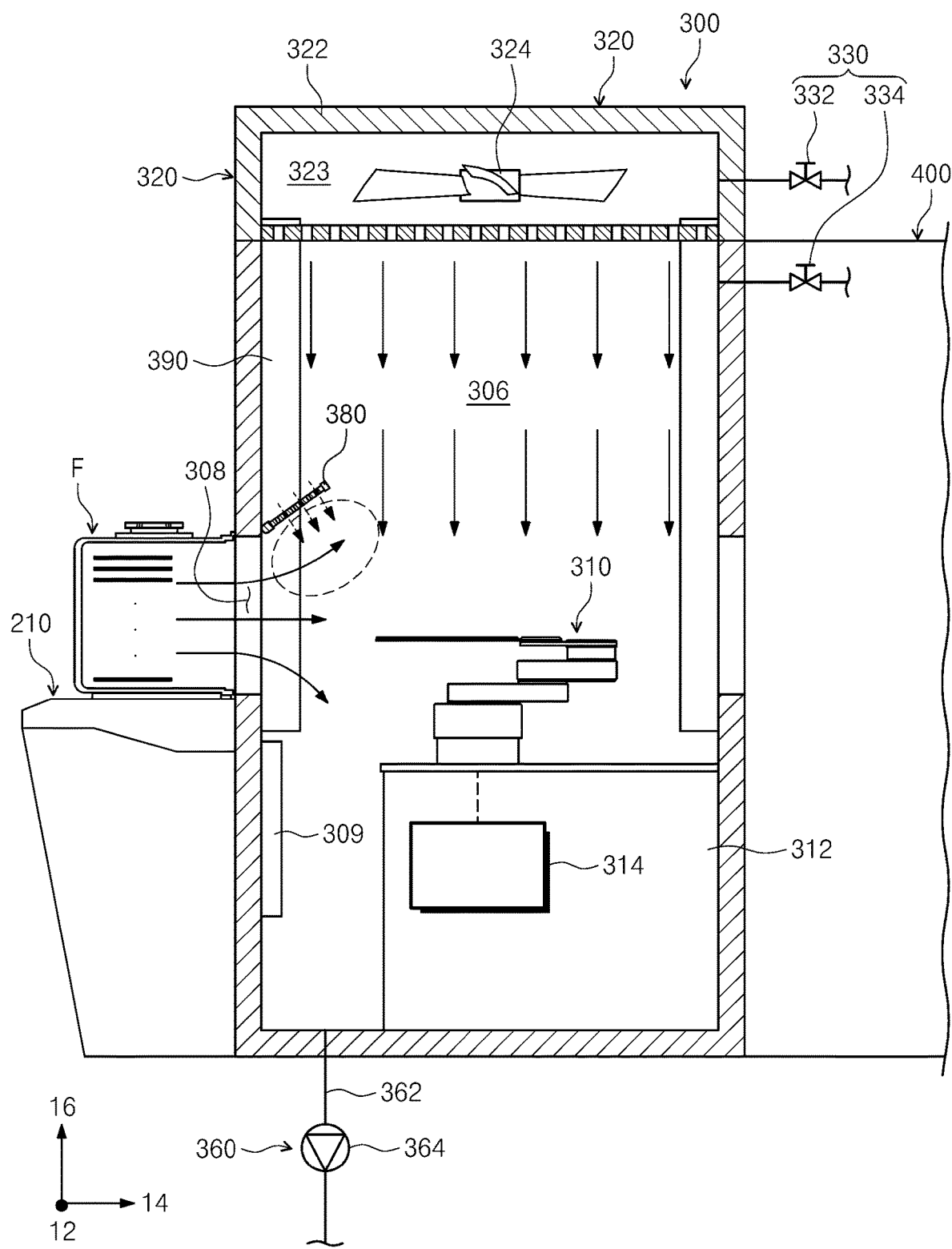
FIG. 5 is a view illustrating an example in which gas flows in the transfer frame of FIG. 3.

FIG. 5 is a view illustrating an example in which gas flows in the transfer frame 300 of FIG. 3. Referring to FIG. 5, a door 309 opens the opening 308 in a case where the transfer robot 310 transfers substrates received in the container F. When the opening 308 is opened, a gas flow in the container F is directed toward the transfer space 306. A descending flow of gas supplied by the fan unit 320 collides with the interference member 380 to disperse before colliding with the gas flow directed toward the transfer space 306 from the inside of the container F. Accordingly, a vortex caused by a collision between the descending flow of the gas supplied by the fan unit 320 and the gas flow directed from the inside of the container F toward the transfer space 306 may be minimized. Furthermore, particles caused by the vortex may be minimized.

Figure 6:
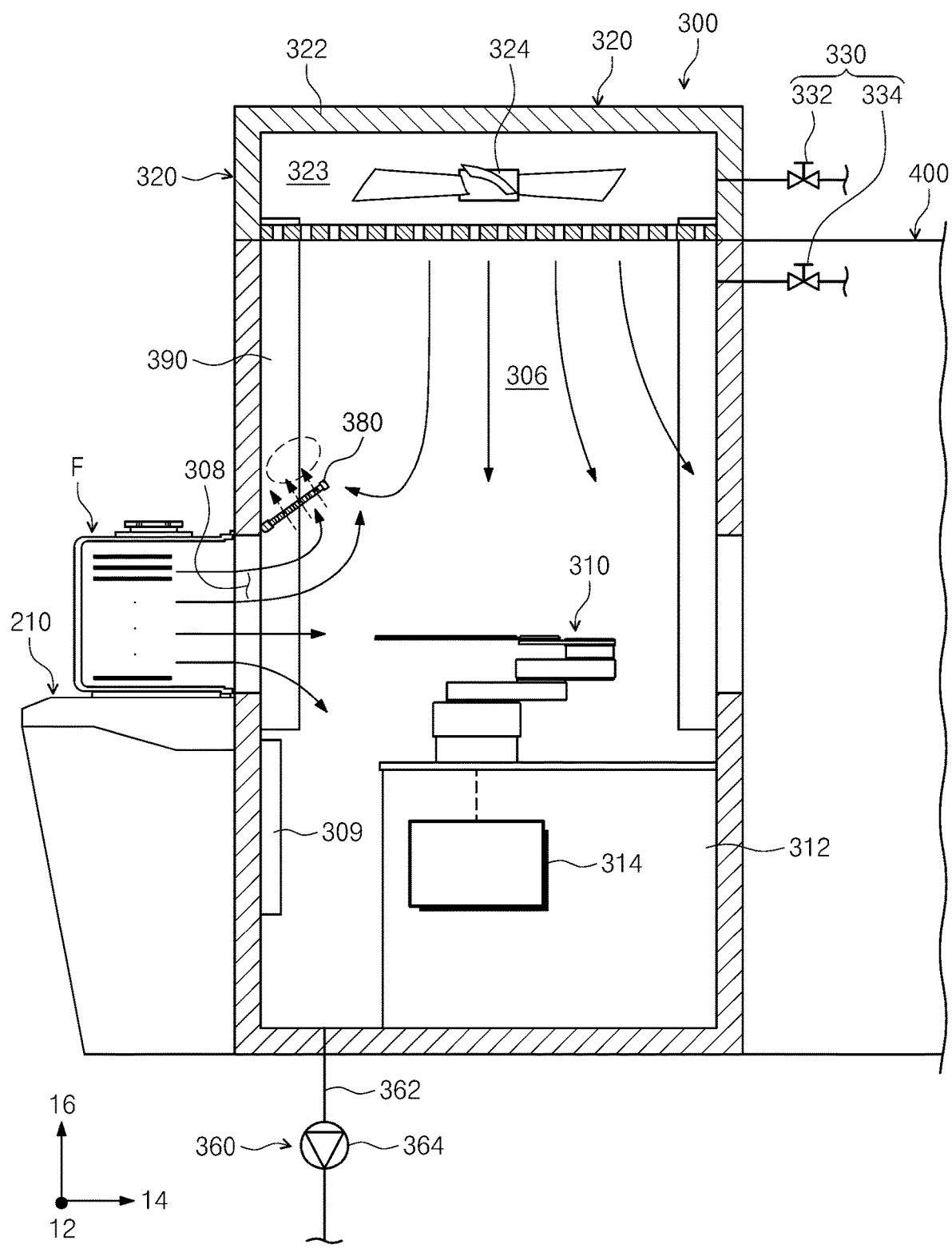
FIG. 6 is a view illustrating another example in which gas flows in the transfer frame of FIG. 3.

FIG. 6 is a view illustrating another example in which gas flows in the transfer frame 300 of FIG. 3. Referring to FIG. 6, in a case where a strong gas flow is directed from the container F to the transfer space 306, the gas flow directed from the container F to the transfer space 306 may be an ascending gas flow. The ascending gas flow out of the container F collides with a descending flow of gas supplied by the fan unit 320, and the gas flows collide with the interference member 380 to disperse before colliding with inner walls of the transfer frame 300. Accordingly, a vortex generated in the transfer space 306 may be minimized. Furthermore, because the interference member 380 is upwardly inclined in the direction away from the opening 308, a risk of collision of the transfer robot 310 with the interference member 380 may be minimized when the transfer robot 310 loads or unloads substrates through the opening 308.

Figure 7:
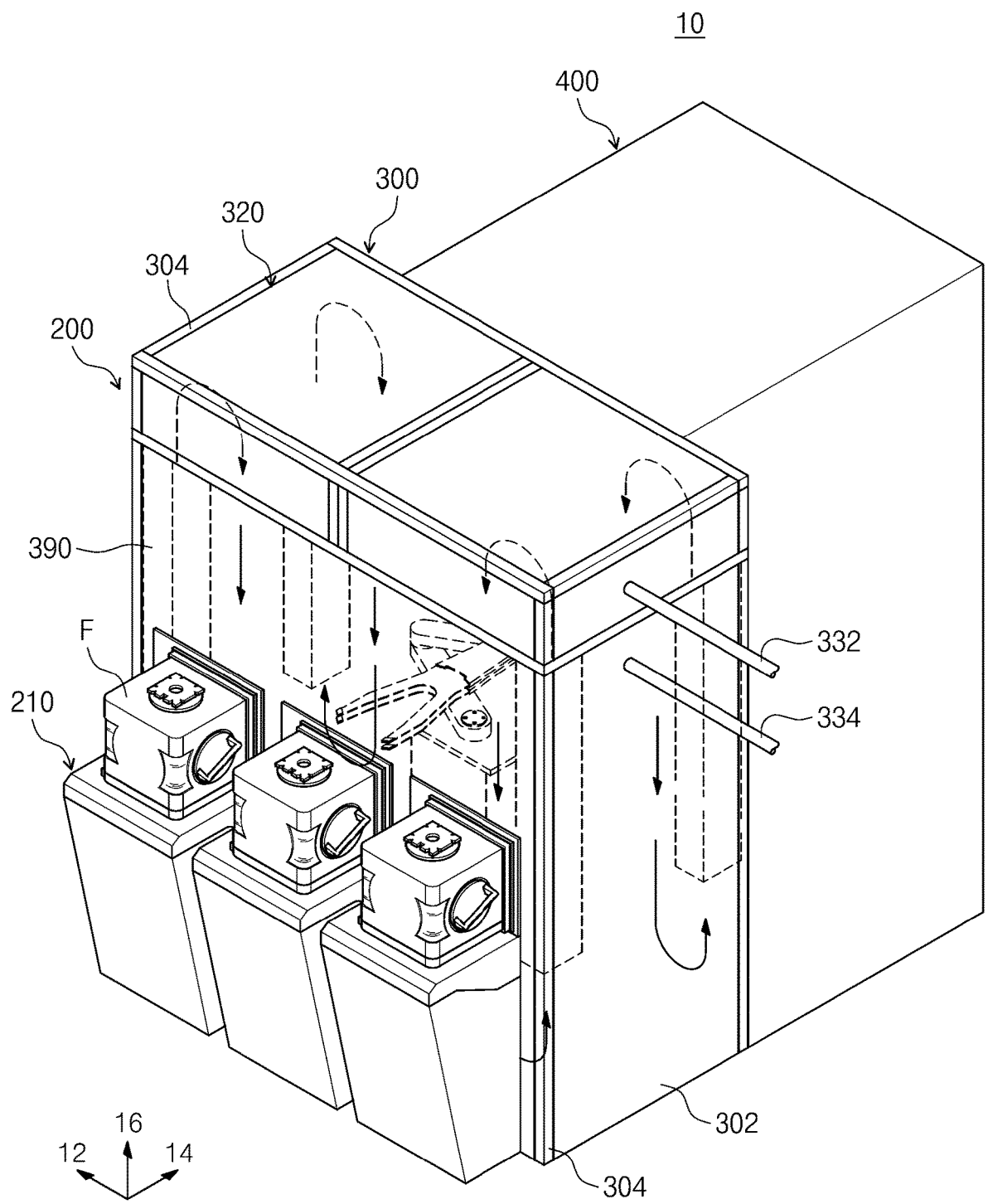
FIG. 7 is a view illustrating an example in which gas circulates in the transfer frame of FIG. 2.

FIG. 7 is a view illustrating an example in which gas circulates in the transfer frame 300 of FIG. 2. Referring to FIG. 7, the transfer frame 300 may include a circulation duct 390. One end of the circulation duct 390 communicates with the inner space 323 of the housing 322 of the fan unit 320. An opposite end of the circulation duct 390 communicates with the transfer space 306. The circulation duct 390 may circulate gas in the transfer space 306 to the inner space 323 of the housing 322. Furthermore, a plurality of circulation ducts 390 may be provided. The circulation ducts 390 may be installed along the perimeter of the transfer space 306. For example, in a case where the transfer frame 300 has a rectangular parallelepiped shape, the circulation ducts 390 may be installed in corners of the transfer frame 300 when viewed from above. Each of the circulation ducts 390 may include a circulation fan (not illustrated) that causes gas to flow into or out of the circulation duct 390.

The controller (not illustrated) may control the index module 200. For example, the controller (not illustrated) may control the gas supply member 330, the exhaust unit 360, and a load lock chamber 230 which will be described below. Furthermore, the controller (not illustrated) may control the substrate processing apparatus 10 to perform a substrate processing method which will be described below.

Figure 8:
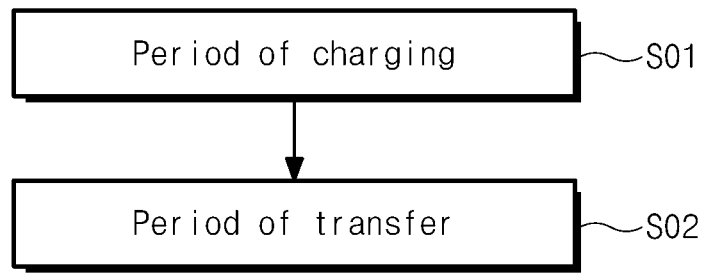
FIG. 8 is a flowchart illustrating a substrate processing method according to an embodiment of the inventive concept.
Figure 9:
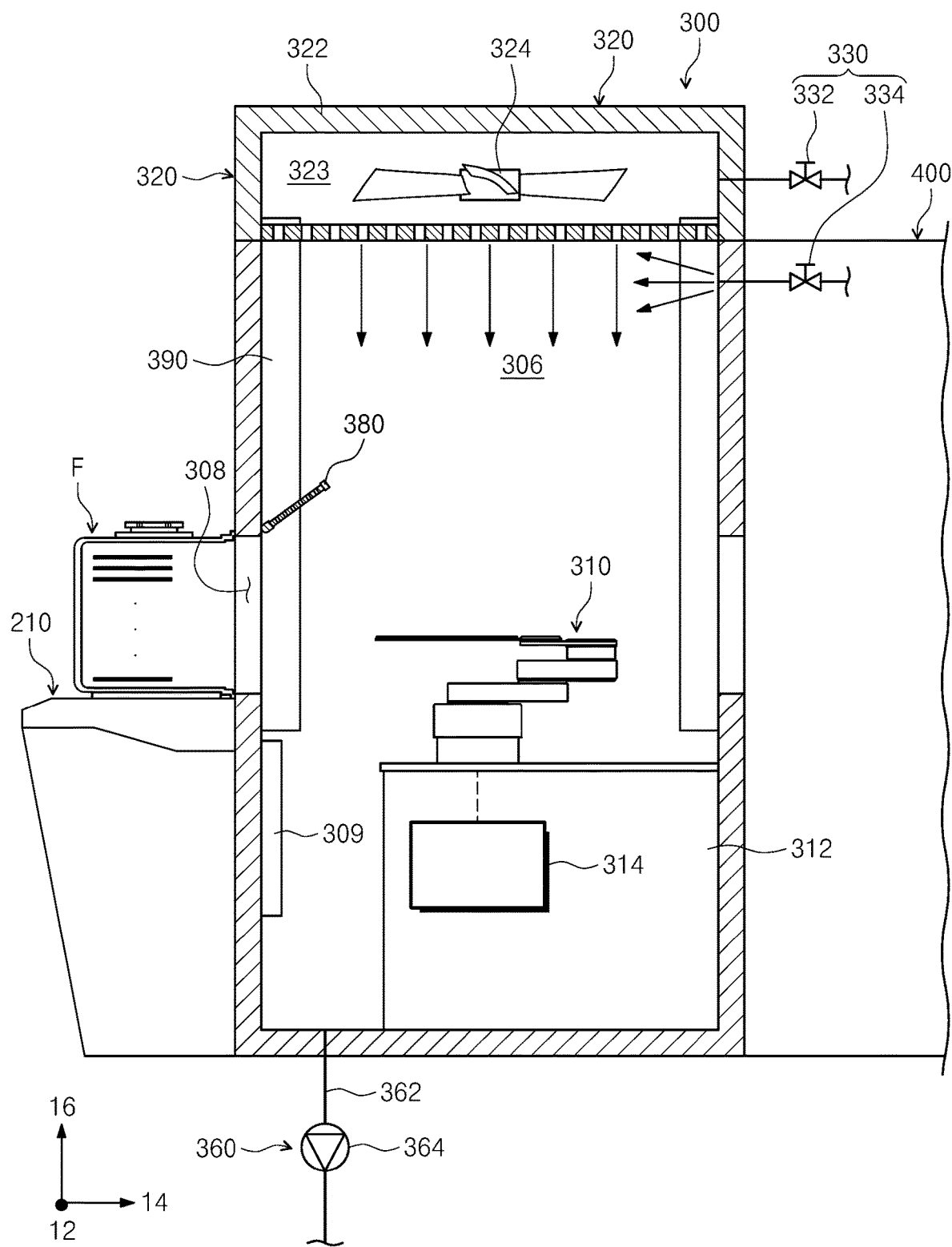
FIG. 9 is a view illustrating an example in which gas is supplied into the transfer frame for a period of charging in FIG. 8.
Figure 10:
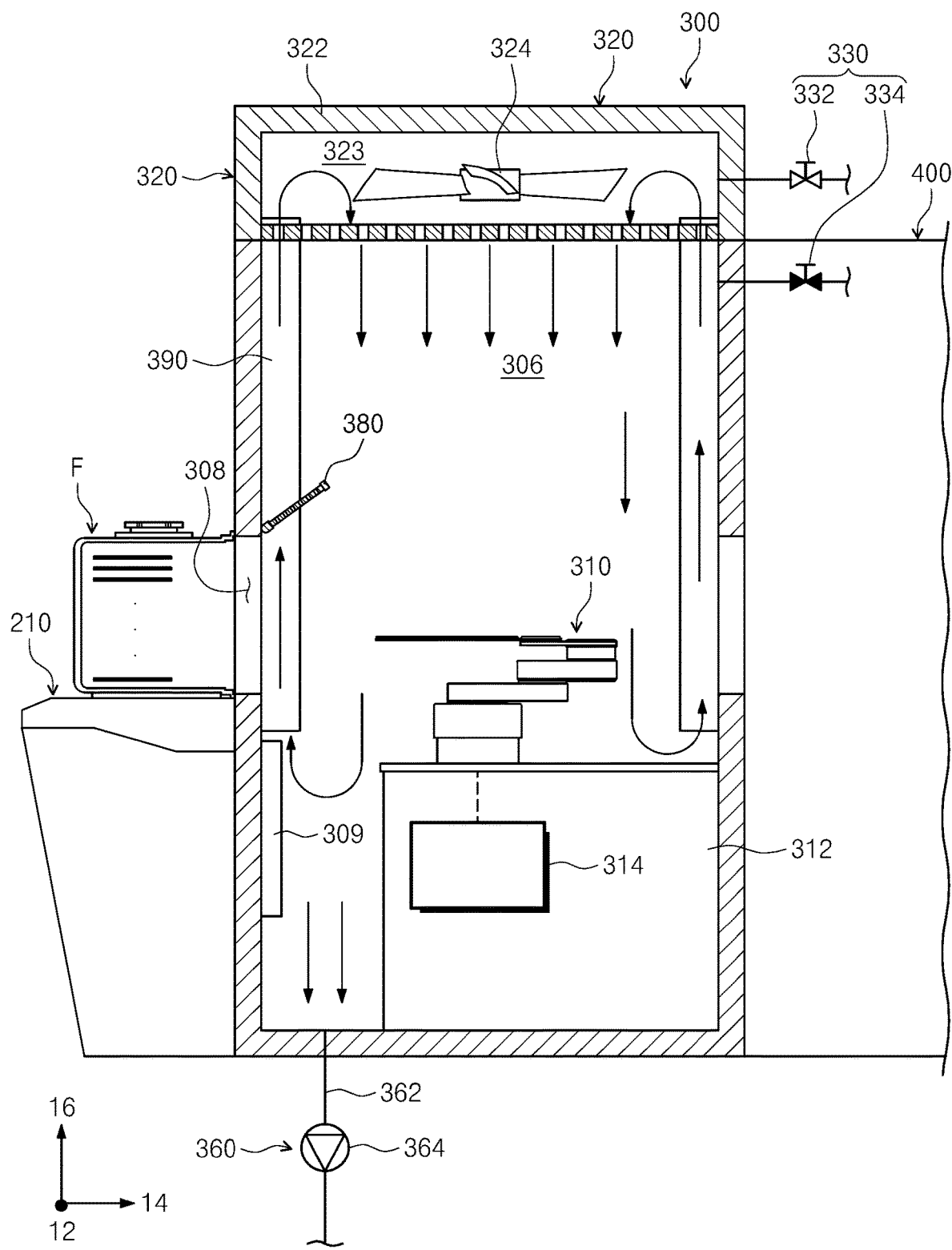
FIG. 10 is a view illustrating an example in which gas flows in the transfer frame for a period of transfer in FIG. 8.

FIG. 8 is a flowchart illustrating a substrate processing method according to an embodiment of the inventive concept. FIG. 9 is a view illustrating an example in which gas is supplied into the transfer frame 300 for a period of charging in FIG. 8. FIG. 10 is a view illustrating an example in which gas flows in the transfer frame 300 for a period of transfer in FIG. 8. Referring to FIGS. 8 to 10, the substrate processing method may include a period of charging S01 and a period of transfer S02.

The period of charging S01 is a step prior to the period of transfer S02. For example, the period of charging S01 may be a period before the transfer robot 310 starts to transfer substrates. For the period of charging S01, the second gas supply line 334 supplies gas into the transfer space 306 at the same that the first gas supply line 332 supplies gas into the inner space 323 of the fan unit 320. For the period of charging S01, the valves installed on the first gas supply line 332 and the second gas supply line 334 may be open. For the period of charging S01, the inside of the transfer space 306 may rapidly reach an inert gas atmosphere because the first gas supply line 332 and the second gas supply line 334 supply the gas into the transfer space 306. Furthermore, the amount of gas supplied per unit time by the second gas supply line 334 may be greater than the amount of gas supplied per unit time by the first gas supply line 332. Accordingly, the inside of the transfer space 306 may more rapidly reach an inert gas atmosphere.

Although it has been exemplified that both the first gas supply line 332 and the second gas supply line 334 supply the gas for the period of charging S01, the inventive concept is not limited thereto. For example, for the period of charging S01, the second gas supply line 334 alone may supply the gas into the transfer space 306.

The period of transfer S02 may be a period during which substrates are transferred. Furthermore, the period of transfer S02 may refer to a period during which the transfer space 306 reaches an inert gas atmosphere and is stabilized. The period of transfer S02 may be after the period of charging S01. For the period of transfer S02, the first gas supply line 332 supplies gas into the fan unit 320. For the period of transfer S02, the valve installed on the first gas supply line 332 may be open.

For the period of transfer S02, the fan unit 320 may supply a descending flow of gas into the transfer space 306. Furthermore, for the period of transfer S02, the gas supplied into the transfer space 306 may circulate through the circulation duct 390 into the inner space 323 of the fan unit 320. For example, for the period of transfer S02, 50% to 90% of the gas supplied into the transfer space 306 may circulate through the circulation duct 390.

In the related art, a large amount of inert gas supplied into the index module is consumed. In a case where an inert gas is supplied into the container F to prevent an external gas flow from being introduced into the container F, the inert gas needs to be consistently supplied into the container F, and therefore a large amount of inert gas is consumed. Furthermore, even in the case of maintaining the transfer space 306 of the transfer frame 300 in an inert gas atmosphere, a large amount of inert gas is consumed because the inert gas has to be continually supplied into the transfer space 306. However, according to an embodiment of the inventive concept, a period during which gas is supplied into the transfer frame 300 is divided into the period of charging S01 and the period of transfer S02. For the period of charging S01, both the first gas supply line 332 and the second gas supply line 334 supply gas into the transfer space 306 of the transfer frame 300 to cause the transfer space 306 to rapidly reach an inert gas atmosphere. If the inert gas atmosphere in the transfer space 306 is stabilized for the period of charging S01, the first gas supply line 332 independently supplies gas for the period of transfer S02. Furthermore, the gas supplied into the transfer space 306 circulates through the circulation duct 390 for the period of transfer S02. Accordingly, the amount of gas consumed for the period of transfer S02 may be minimized.

Furthermore, in the related art, a gas flow directed from the inside of the container F toward the transfer space 306 and a descending flow of gas supplied by the fan unit 320 collide with each other. The collision causes a vortex in the transfer space 306, and the vortex collides with components in the transfer frame 300 to cause particles. However, according to an embodiment of the inventive concept, the interference member 380 is installed at the upper end of the opening 308. The interference member 380 minimizes the collision between the gas flow directed from the inside of the container F toward the transfer space 306 and the descending flow of gas supplied by the fan unit 320. For example, when the gas supplied by the fan unit 320 passes through the interference member 380 in a mesh form, the gas disperses. The dispersion of the gas may minimize the collision between the descending flow of the gas supplied by the fan unit 320 and the gas flow directed from the inside of the container F toward the transfer space 306. Accordingly, the vortex in the transfer space 306 and the particles caused by the vortex may be minimized.

Figure 11:
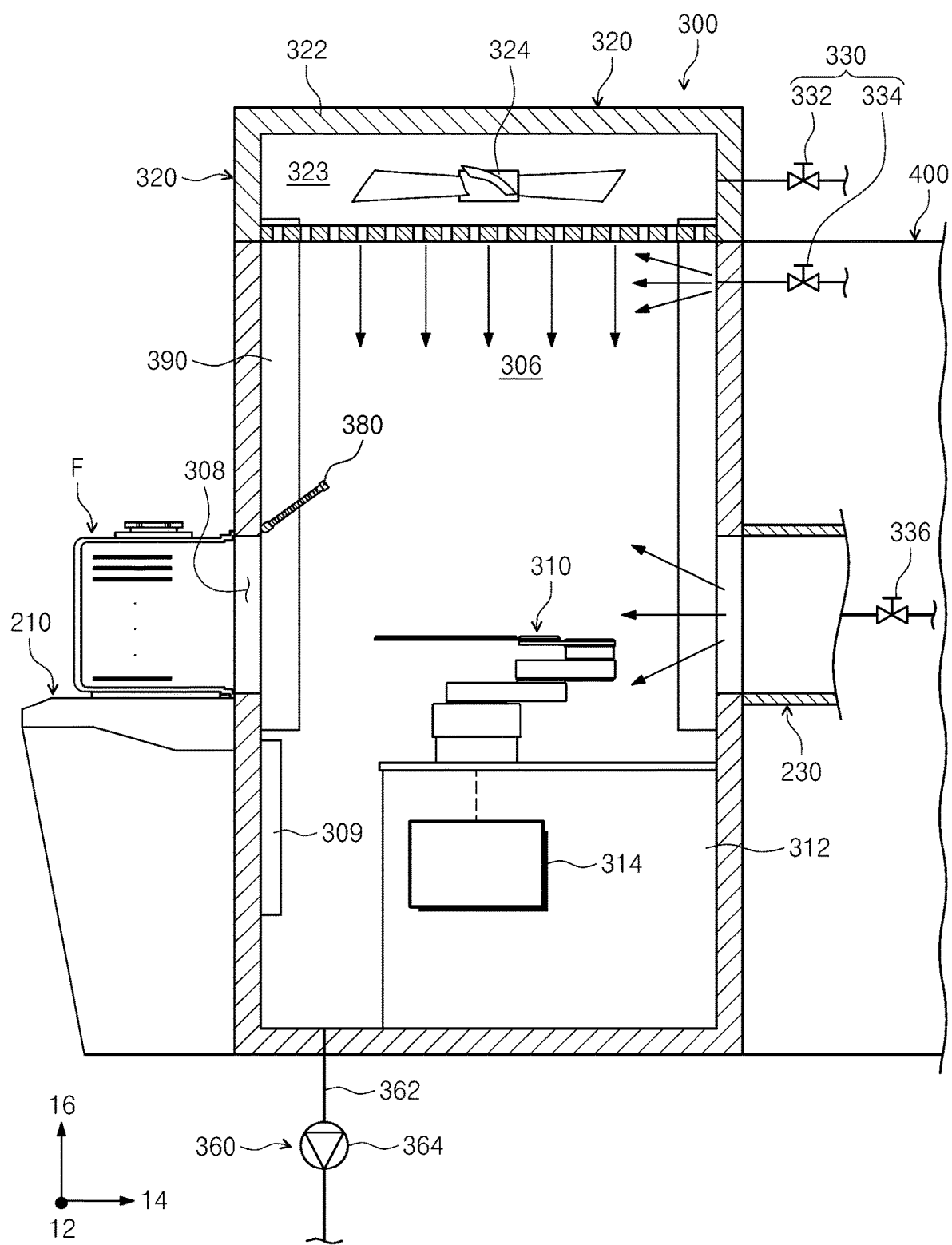
FIG. 11 is a view illustrating a substrate processing method according to another embodiment of the inventive concept.

Although it has been exemplified that the first gas supply line 332 and the second gas supply line 334 supply the gas into the transfer space 306 for the period of charging S01, the inventive concept is not limited thereto. For example, as illustrated in FIG. 11, the gas supply member 330 may include a third gas supply line 336. The third gas supply line 336 is connected to the load lock chamber 230 disposed between the transfer frame 300 and the process module 400. The third gas supply line 336 supplies gas into the load lock chamber 230. For the period of charging S01, the third gas supply line 336 may supply gas into the transfer space 306, in addition to the supply of gas by the first gas supply line 332 and the second gas supply line 334. For example, for the period of charging S01, the controller (not illustrated) may control the load lock chamber 230 and the gas supply member 330 to open a door for opening or closing an entrance through which a substrate is transferred between the load lock chamber 230 and the transfer frame 300 and to cause the gas supplied into the load lock chamber 230 by the third gas supply line 336 to flow into the transfer space 306.

Figure 12:
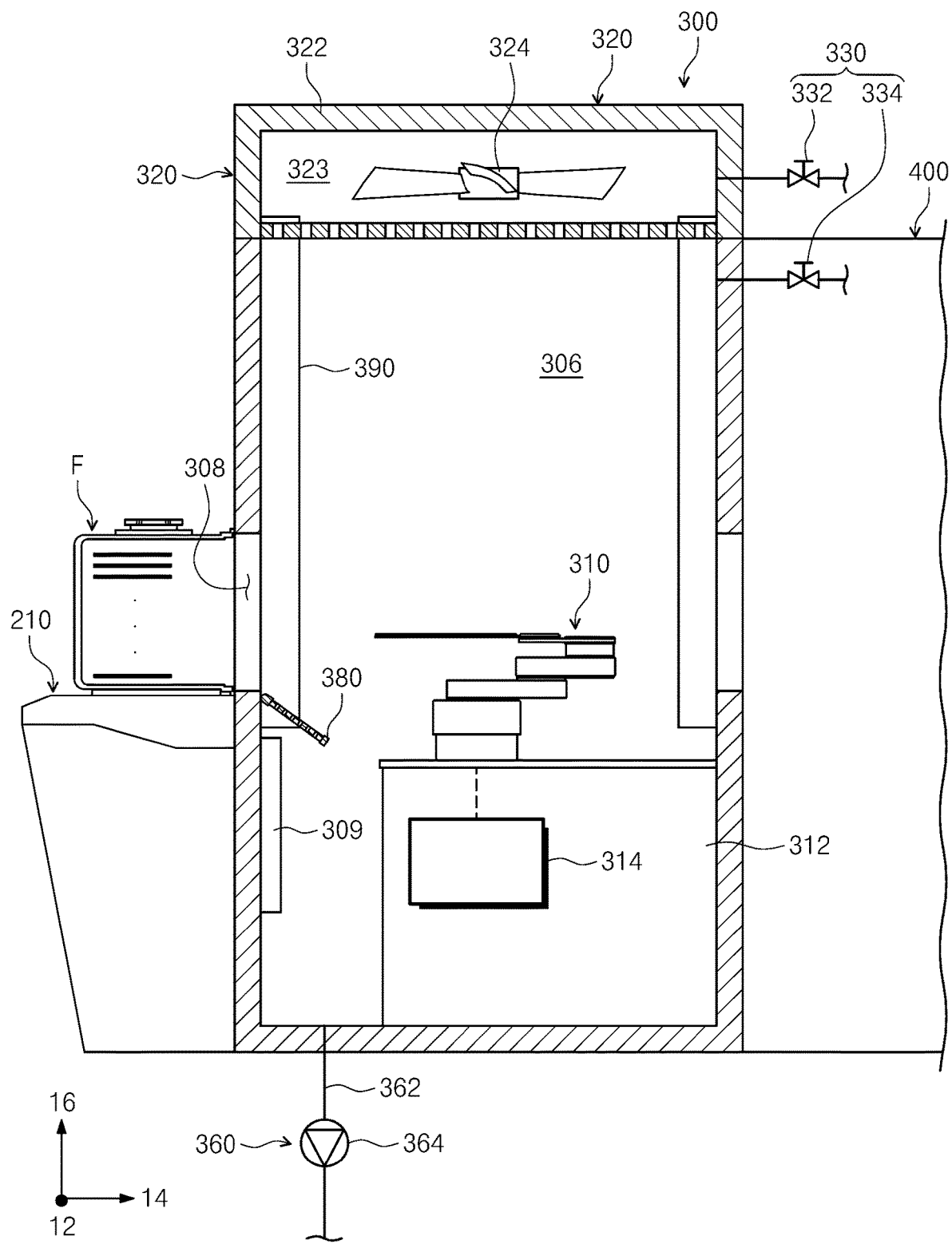
FIG. 12 is a view illustrating a transfer frame according to another embodiment of the inventive concept.
Figure 13:
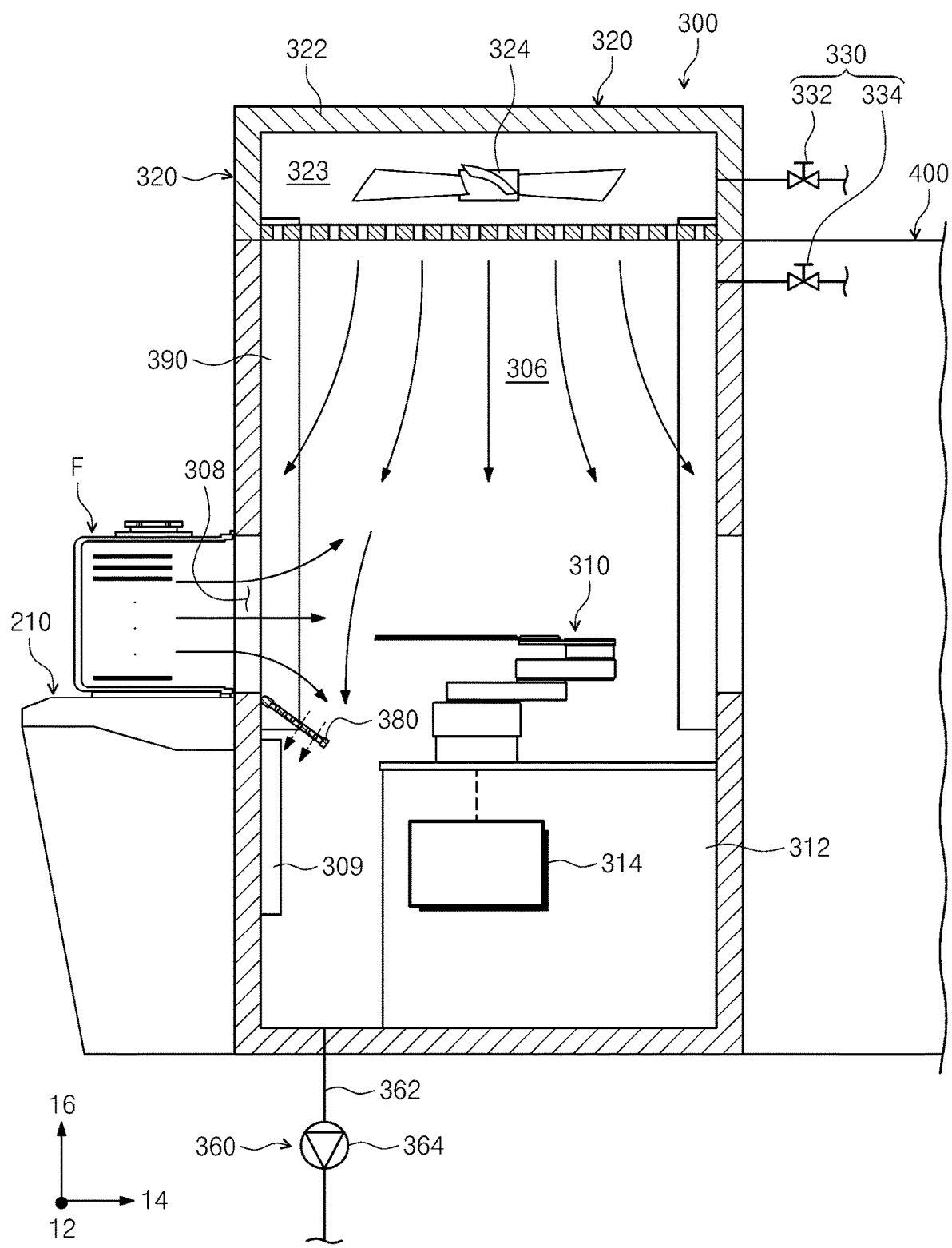
FIG. 13 is a view illustrating an example in which gas flows in the transfer frame of FIG. 12.
Figure 14:
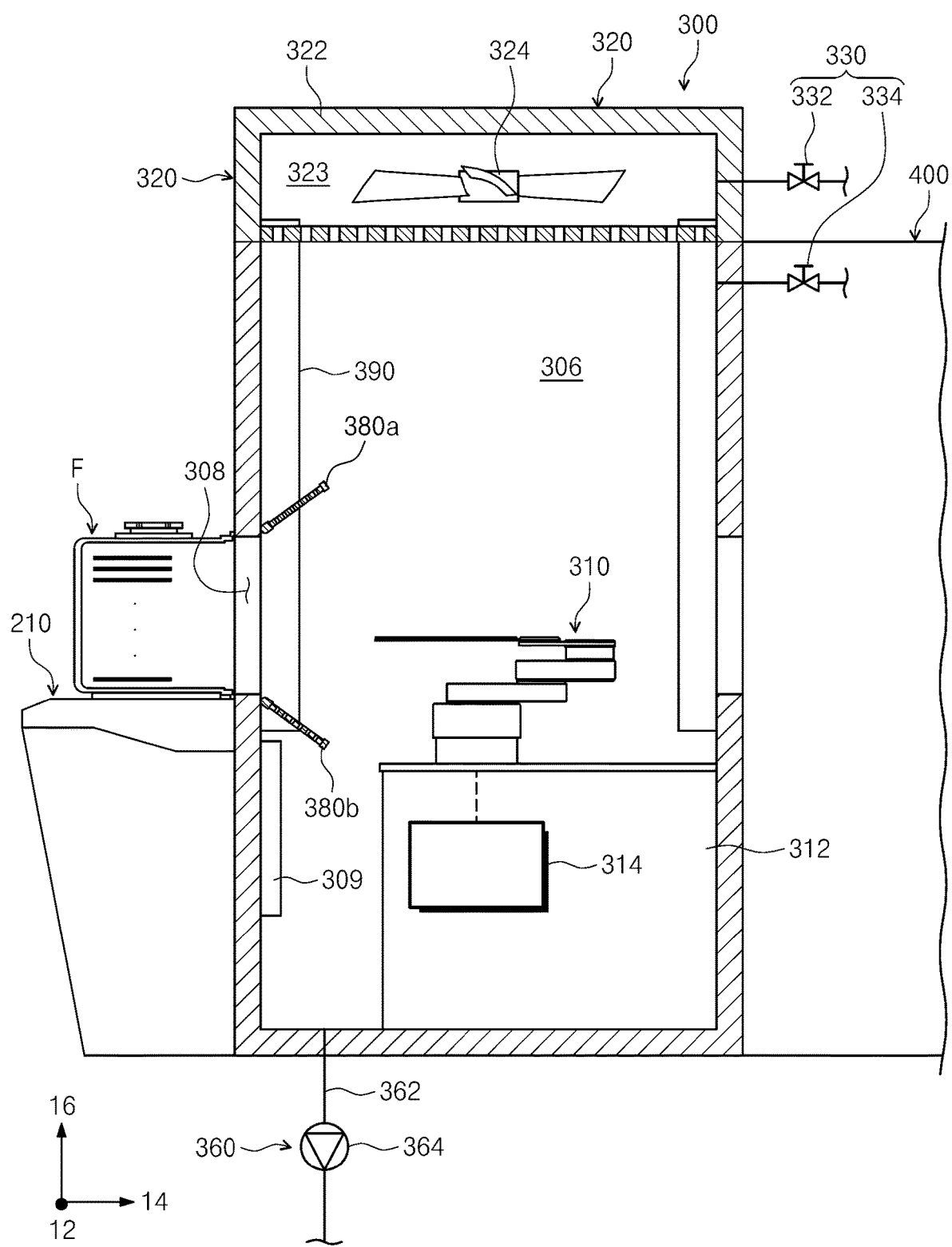
FIG. 14 is a view illustrating a transfer frame according to another embodiment of the inventive concept.

Although it has been exemplified that the interference member 380 is installed at the upper end of the opening 308, the inventive concept is not limited thereto. For example, as illustrated in FIG. 12, the interference member 380 may be installed at a lower end of the opening 308 so as to be adjacent to the opening 308. In the case where the interference member 380 is installed at the lower end of the opening 308, the interference member 380 may be downwardly inclined in a direction away from the opening 308. In this case, as illustrated in FIG. 13, vortexes on the base 312 and the inner walls of the transfer frame 300 adjacent to the base 312 may be minimized.

Although it has been exemplified that the interference member 380 is installed at the upper end or the lower end of the opening 308, the inventive concept is not limited thereto. For example, the interference member 380 may include an upper interference member 380a and a lower interference member 380b. The upper interference member 380a may be installed at the upper end of the opening 308 so as to be adjacent to the opening 308. Furthermore, the upper interference member 380a may be upwardly inclined in a direction away from the opening 308. The lower interference member 380b may be installed at the lower end of the opening 308. Furthermore, the lower interference member 380b may be downwardly inclined in a direction away from the opening 308. The structures and functions of the upper interference member 380a and the lower interference member 380b are identical or similar to the above-described contents. Therefore, specific descriptions thereabout will be omitted.

Figure 15:
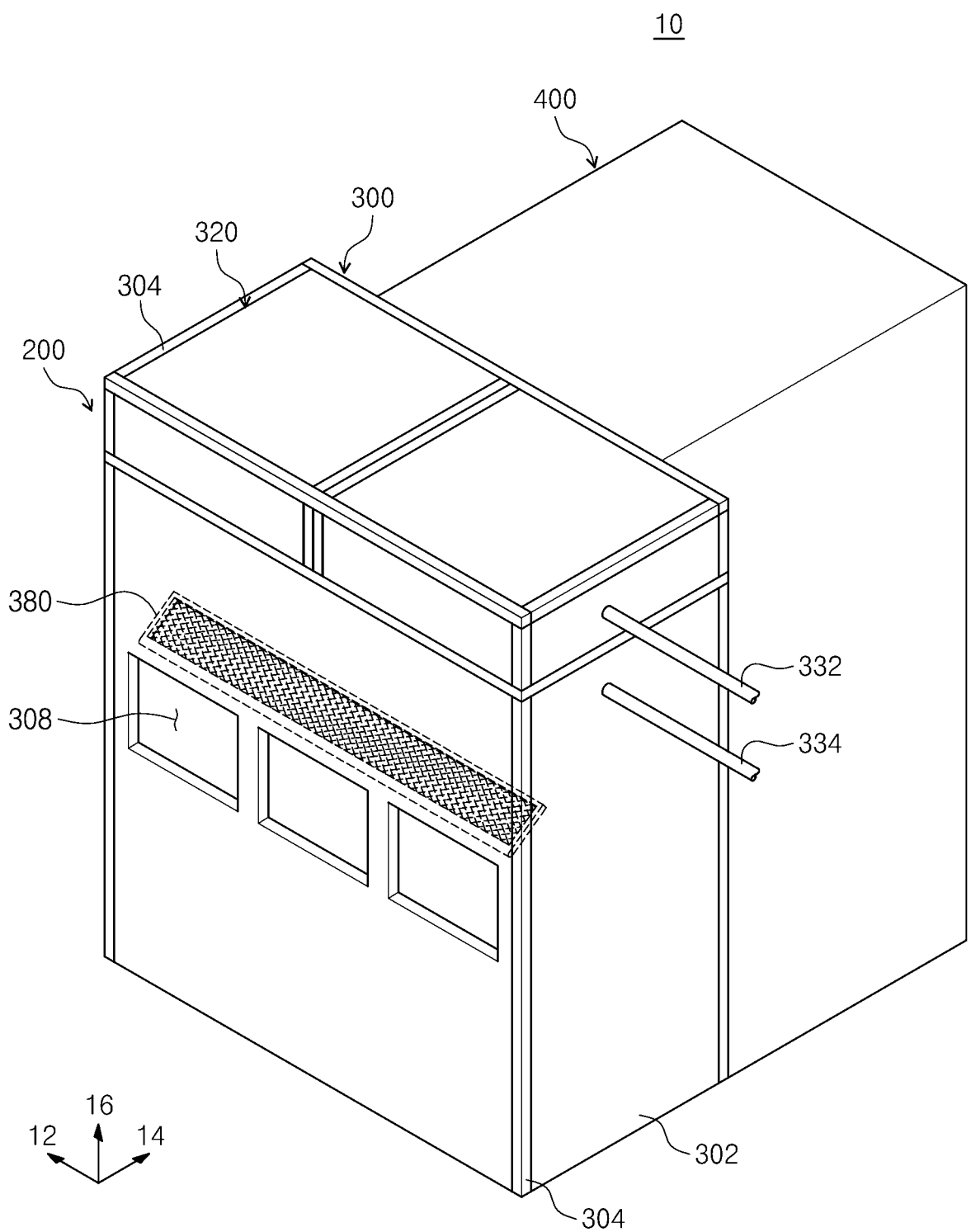
FIG. 15 is a view illustrating an interference member according to another embodiment of the inventive concept.

Although it has been exemplified that the plurality of interference members 380 correspond to the plurality of openings 308, respectively, the inventive concept is not limited thereto. For example, as illustrated in FIG. 15, a single interference member 380 may be installed along a straight line that connects the upper ends of the plurality of openings 308.

According to the embodiments, the inventive concept may efficiently process substrates.

Furthermore, the inventive concept may minimize particles in the index module.

Moreover, the inventive concept may minimize attachment of particles to a substrate.

In addition, the inventive concept may minimize the amount of inert gas supplied into the index module when a substrate is transferred.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe the exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
    an index module; and
    a process module configured to process the substrate, wherein the index module includes:
        a load port on which a container having the substrate received therein is placed; and
        a transfer frame disposed between the load port and the process module, the transfer frame having a transfer space therein,
        wherein the transfer frame includes:
            a fan unit provided above the transfer space and configured to supply a descending flow of gas into the transfer space;
            a transfer robot disposed in the transfer space and configured to transfer the substrate between the container placed on the load port and the process module; and
            an interference member configured to minimize a collision between the descending gas flow and a gas flow directed toward the transfer space from the inside of the container,
        wherein the transfer frame has an opening formed therein, through which the substrate is transferred between the container and the transfer frame,
        wherein the interference member includes an upper interference member installed at an upper end of the opening so as to be adjacent to the opening, and
            wherein the upper interference member is upwardly inclined in a direction away from the opening.

2. The apparatus of claim 1, wherein the upper interference member is provided in a mesh form.

3. The apparatus of claim 1, wherein the interference member further includes a lower interference member installed at a lower end of the opening so as to be adjacent to the opening.

4. The apparatus of claim 3, wherein the lower interference member is provided in a mesh form.

5. The apparatus of claim 3, wherein the lower interference member is downwardly inclined in a direction away from the opening.

6. The apparatus of claim 1, wherein the fan unit includes:
    a housing having an inner space; and
    a fan disposed in the inner space and configured to cause the gas to flow into or out of the inner space, and
    wherein the transfer frame further includes a circulation duct configured to circulate the gas in the transfer space into the inner space.

7. The apparatus of claim 6, wherein the transfer frame has a rectangular parallelepiped shape, and
    wherein a plurality of circulation ducts are installed in corners of the transfer frame when viewed from above.

8. The apparatus of claim 7, wherein the transfer frame further includes:
    a plurality of panels;
    a coupling frame configured to combine the plurality of panels; and
    gaskets provided between the panels and the coupling frame, and
    wherein the transfer frame has the transfer space formed by combining the plurality of panels together.

9. The apparatus of claim 8, wherein the gaskets are rubber gaskets or liquid gaskets.

10. The apparatus of claim 6, wherein a circulation fan is installed in the circulation duct to cause the gas to flow into or out of the circulation duct.

11. The apparatus of claim 1, further comprising:
    an actuator configured to drive the transfer robot,
    wherein the transfer frame further includes a base configured to isolate a space in which the actuator is provided from the transfer space.

12. The apparatus of claim 1, wherein the index module further includes a gas supply member configured to supply the gas into the transfer space, and
    wherein the gas supply member includes:
        a first gas supply line configured to supply the gas into an inner space of a housing that the fan unit includes; and
        a second gas supply line configured to directly supply the gas into the transfer space.

13. The apparatus of claim 12, wherein the apparatus further comprises a controller configured to control the gas supply member, and
    wherein the controller controls the gas supply member to:
        supply the gas from the first gas supply line to the fan unit for a period of transfer during which the substrate is transferred; and
        supply the gas through the second gas supply line or through the first gas supply line and the second gas supply line for a period of charging prior to the period of transfer.

14. The apparatus of claim 13, wherein the index module further includes a load lock chamber disposed between the transfer frame and the process module,
    wherein the gas supply member further includes a third gas supply line connected to the load lock chamber and configured to supply gas into the load lock chamber, and
    wherein the controller additionally controls the load lock chamber and, for the period of charging, controls the load lock chamber and the third gas supply line to open a door configured to open or close an entrance through which the substrate is transferred between the load lock chamber and the transfer frame and cause the gas supplied into the load lock chamber from the third gas supply line to flow into the transfer space.

15. A method for processing a substrate by using the substrate processing apparatus of claim 12, the method comprising:
    supplying the gas from the first gas supply line to the fan unit for a period of transfer during which the substrate is transferred; and
    supplying the gas through the second gas supply line or through the first gas supply line and the second gas supply line for a period of charging prior to the period of transfer.

16. An apparatus for processing a substrate, the apparatus comprising:
    an index module; and
    a process module configured to process the substrate,
    wherein the index module includes:
        a load port on which a container having the substrate received therein is placed;

a transfer frame disposed between the load port and the process module, the transfer frame having a transfer space therein;
an exhaust unit configured to discharge the gas in the transfer space to the outside; and
a controller configured to control a fan unit and the exhaust unit,
wherein the transfer frame includes:
  the fan unit provided above the transfer space and configured to supply a descending flow of gas into the transfer space, wherein the controller controls the fan unit and the exhaust unit to maintain a pressure difference of 50 Pa to 1000 Pa between the transfer space and the outside of the index module;
  a transfer robot disposed in the transfer space and configured to transfer the substrate between the container placed on the load port and the process module; and
  an interference member configured to minimize a collision between the descending gas flow and a gas flow directed toward the transfer space from the inside of the container,
  wherein the transfer frame has an opening formed therein, through which the substrate is transferred between the container and the transfer frame,
  wherein the interference member includes an upper interference member installed at an upper end of the opening so as to be adjacent to the opening.

17. An apparatus for processing a substrate, the apparatus comprising:
an index module; and
a process module configured to process the substrate,
wherein the index module includes:
  a load port on which a container having the substrate received therein is placed; and
  a transfer frame disposed between the load port and the process module, the transfer frame having a transfer space therein,
wherein the transfer frame includes:
  a fan unit provided above the transfer space and configured to supply a descending flow of gas into the transfer space;
  a transfer robot disposed in the transfer space and configured to transfer the substrate between the container placed on the load port and the process module; and
  at least one interference member configured to minimize a collision between the descending gas flow and a gas flow directed toward the transfer space from the inside of the container,
  wherein the transfer frame has an opening formed therein, through which the substrate is transferred between the container and the transfer frame,
  wherein the at least one interference member includes a mesh form installed adjacent to the opening, and
  wherein the at least one interference member is at least one of:
    installed at an upper end of the opening so as to be adjacent to the opening and upwardly inclined in a direction away from the opening, and
    installed at a lower end of the opening so as to be adjacent to the opening.

* * * * *